(12) United States Patent
Hshieh et al.

(10) Patent No.: US 6,645,815 B2
(45) Date of Patent: Nov. 11, 2003

(54) METHOD FOR FORMING TRENCH MOSFET DEVICE WITH LOW PARASITIC RESISTANCE

(75) Inventors: Fwu-Iuan Hshieh, Saratoga, CA (US); Koon Chong So, Fremont, CA (US); John E. Amato, Tracy, CA (US); Brian D. Pratt, Tracy, CA (US)

(73) Assignee: General Semiconductor, Inc., Melville, NY (US)

( * ) Notice: Subject to any disclaimer, the term of this patent is extended or adjusted under 35 U.S.C. 154(b) by 0 days.

(21) Appl. No.: 10/010,483

(22) Filed: Nov. 20, 2001

(65) Prior Publication Data

US 2003/0096480 A1 May 22, 2003

(51) Int. Cl.[7] .............................................. H01L 21/336
(52) U.S. Cl. ............................... 438/270; 148/DIG. 126
(58) Field of Search .................................. 438/270, 212, 438/589, FOR 192, 202; 148/DIG. 126

(56) References Cited

U.S. PATENT DOCUMENTS

| | | | |
|---|---|---|---|
| 5,072,266 A | 12/1991 | Bulucea et al. | 257/330 |
| 5,541,425 A | 7/1996 | Nishihara | 257/139 |
| 5,689,128 A | 11/1997 | Hshieh et al. | 257/331 |
| 5,866,931 A | 2/1999 | Bulucea et al. | 257/331 |
| 5,907,776 A * | 5/1999 | Hshieh et al. | 438/270 |
| 6,031,265 A | 2/2000 | Hshieh | 257/334 |

* cited by examiner

Primary Examiner—George Fourson
Assistant Examiner—Thanh V Pham
(74) Attorney, Agent, or Firm—Mayer Fortkort & Williams, PC; David B. Bonham, Esq.

(57) ABSTRACT

A method is provided for forming shallow and deep dopant implants adjacent source regions of a first conductivity type within an upper portion of an epitaxial layer in a trench MOSFET device. The method comprises: (a) forming a patterned implantation mask over the epitaxial layer, wherein the patterned implantation mask comprises a patterned insulating region and covers at least a portion of the source regions, and wherein the patterned implantation mask has apertures over at least portions of the epitaxial layer adjacent the source regions; (b) forming shallow dopant regions by a process comprising: (1) implanting a first dopant of a second conductivity type at a first energy level within an upper portion of the epitaxial layer through the apertures and (2) diffusing the first dopant at elevated temperatures to a first depth from an upper surface of the epitaxial layer; (c) forming deep dopant regions by a process comprising: (1) implanting a second dopant of the second conductivity type at a second energy level within an upper portion of the epitaxial layer through the apertures and (2) diffusing the second dopant at elevated temperatures to a second depth from the upper surface of the epitaxial layer; and (d) enlarging apertures in the patterned insulating region. In this method, the second energy level is greater than the first energy level, the second depth is greater than the first depth, and the first and second dopants can be the same or different. The method of the present invention can be used, for example, to form a device that comprises a plurality of trench MOSFET cells.

20 Claims, 6 Drawing Sheets

METHOD FOR FORMING TRENCH MOSFET DEVICE WITH LOW PARASITIC RESISTANCE

BACKGROUND OF THE INVENTION

The present invention relates to trench MOSFET devices, and more particularly to trench MOSFET devices having low parasitic resistance.

A trench MOSFET (metal-oxide-semiconductor field-effect transistor) is a transistor in which the channel is formed vertically and the gate is formed in a trench extending between the source and drain. The trench, which is lined with a thin insulator layer such as an oxide layer and filled with a conductor such as polysilicon (i.e., polycrystalline silicon), allows less constricted current flow and thereby provides lower values of specific on-resistance. Examples of trench MOSFET transistors are disclosed, for example, in U.S. Pat. Nos. 5,072,266, 5,541,425, 5,866,931 and 6,031,265, the disclosures of which are hereby incorporated by reference.

As a specific example, FIG. 1 illustrates half of a hexagonally shaped trench MOSFET structure 21 disclosed in U.S. Pat. No. 5,072,266. The structure includes an n+ substrate 23, upon which is grown a lightly doped n epitaxial layer 25 of a predetermined depth $d_{epi}$. Within the epitaxial layer 25, p body region 27 (p, p+) is provided. In the design shown, the p body region 27 is substantially planar (except in a central region) and typically lays a distance $d_{min}$ below the top surface of the epitaxial layer. Another layer 28 (n+) overlying most of the p body region 27 serves as source for the device. A series of hexagonally shaped trenches 29 are provided in the epitaxial layer, opening toward the top and having a predetermined depth $d_{tr}$. The trenches 29 are typically lined with oxide and filled with conductive polysilicon, forming the gate for the MOSFET device. The trenches 29 define cell regions 31 that are also hexagonally shaped in horizontal cross-section. Within the cell region 31, the p body region 27 rises to the top surface of the epitaxial layer and forms an exposed pattern 33 in a horizontal cross section at the top surface of the cell region 31. In the specific design illustrated, the p+ central portion of the p body region 27 extends to a depth $d_{max}$ below the surface of the epitaxial layer that is greater than the trench depth $d_{tr}$ for the transistor cell so that breakdown voltage is away from the trench surface and into the bulk of the semiconductor material.

A typical MOSFET device includes numerous individual MOSFET cells that are fabricated in parallel within a single chip (i.e., a section of a semiconductor wafer). Hence, the chip shown in FIG. 1 contains numerous hexagonal-shaped cells 31 (portions of five of these cells are illustrated). Cell configurations other than hexagonal configurations are commonly used, including square-shaped configurations. In a design like that shown in FIG. 1, the substrate region 23 acts as a common drain contact for all of the individual MOSFET cells 31. Although not illustrated, all the sources for the MOSFET cells 31 are typically shorted together via a metal source contact that is disposed on top of the n+ source regions 28. An insulating region, such as borophosphosilicate glass (not shown) is typically placed between the polysilicon in the trenches 29 and the metal source contact to prevent the gate regions from being shorted with the source regions. Consequently, to make gate contact, the polysilicon within the trenches 29 is typically extended into a termination region beyond the MOSFET cells 31, where a metal gate contact is provided on the polysilicon. Since the polysilicon gate regions are interconnected with one another via the trenches, this arrangement provides a single gate contact for all the gate regions of the device. As a result of this scheme, even though the chip contains a matrix of individual transistor cells 31, these cells 31 behave as a single large transistor.

It has been found that, as the sheet resistance over the p-body increases, the voltage drop across the p-body also increases, making the parasitic NPN transistor formed by the source, body and drain more susceptible to being incidentally turned on. For example, during avalanche breakdown, the parasitic transistor can be activated incidentally, which can seriously degrade the overall performance of the device and can even cause permanent damage to the device.

One approach by which the resistance of the body region (and hence the voltage drop across the body region) can be decreased in a trench MOSFET device is described in U.S. Pat. No. 6,031,265. FIG. 2 is taken from this patent and illustrates a portion of a trench MOSFET in which an N+ substrate 105 supports an N epi-layer 110. Each transistor cell of this device includes a trenched gate 125, an N+ source region 140, and a P-body region 130. An insulation layer 145 is also provided as is typical. Each transistor cell further includes a deep P+ region 138 formed in the P-body region. The deep P+ region 138 has a higher P-dopant concentration than the surrounding P-body, lowering the parasitic resistance of the P-body region 130 and improving the robustness of the transistor cell. This is achieved because the voltage drop across the body regions of the device is reduced, likewise reducing the parasitic resistance and hence reducing the likelihood of incidentally turning on the parasitic NPN transistors. A shallow P+ region 139 is further provided in the body region 130 to reduce the contact resistance at the metal contact 170.

In the process described in U.S. Pat. No. 6,031,265, the P-type dopant used to form deep P+ regions 138 and shallow P+ regions 139 is implanted through final contact apertures formed in the insulating layer 145. Because the dopant can move into the channel of the body region 130 (which is found along the trenched gate 125) during subsequent diffusion and adversely impact device performance, care should be taken to ensure that the P-dopant is implanted sufficiently far from the channel. However, this action can restrict the use of wider insulating layer 145 apertures, because such use would place the P-dopant near the channel. Wider insulating layer 145 apertures may be desired, for example, because they provide greater contact area for the source regions 140 of the device.

SUMMARY OF THE INVENTION

The present invention provides an improved method for forming trench MOSFET devices with low parasitic resistance.

According to an embodiment of the invention, a method is provided for forming a device that comprises a plurality of trench MOSFET cells. The method comprises: (a) providing a substrate of a first conductivity type; (b) depositing an epitaxial layer of first conductivity type over the substrate, where the epitaxial layer has a lower majority carrier concentration than the substrate; (c) etching trenches into the epitaxial region from an upper surface of the epitaxial layer; (d) forming a first insulating region which lines at least a portion of the trenches; (e) forming a conductive region within the trenches and adjacent the first insulating region; (f) forming body regions of a second conductivity type within an upper portion of the epitaxial layer; (g) forming source regions of the first conductivity type within upper portions of the body regions adjacent the trenches; (h) forming an patterned implantation mask comprising a patterned second insulating region over the epitaxial layer, wherein the patterned implantation mask has apertures over at least portions of the body regions adjacent the sources, wherein the patterned implantation mask covers at least portions of the conductive region, and wherein the patterned implantation mask covers at least portions of the source regions; (i) forming shallow dopant regions by a process comprising: (1) implanting a first dopant of the second conductivity type at a first energy level within upper portions of the body regions through the apertures and (2) diffusing the first dopant at elevated temperatures to a first depth from the upper surface of the epitaxial layer; (j) forming deep dopant regions by a process comprising: (1) implanting a second dopant of the second conductivity type at a second energy level within upper portions of the body regions through the apertures and (2) diffusing the second dopant at elevated temperatures to a second depth from the upper surface of the epitaxial layer; (k) enlarging apertures in the patterned second insulating region; and (l) forming a conductive source contact adjacent upper surfaces of the source regions and upper surfaces of the shallow doped regions. In this method, the deep and shallow dopant regions each has a higher majority carrier concentration than the body regions, the second energy level is greater than the first energy level, the second depth is greater than the first depth, and the first and second dopants can be the same or different.

In addition to the conductive source contact, a conductive drain contact is also beneficially formed adjacent the semiconductor substrate, and a conductive gate contact is beneficially formed adjacent an upper surface of the conductive region remote from the source regions.

In many preferred embodiments, the patterned implantation mask comprises a patterned masking layer disposed over the patterned second insulating region (which may be, for example, a patterned BPSG region). Such a patterned implantation mask can be formed by a method comprising (a) depositing a layer of second insulating material, (b) forming the patterned masking layer over the layer of second insulating material, and (c) etching the layer of second insulating material in areas not covered by the patterned masking layer to form the patterned second insulating region. In these embodiments, the patterned masking layer is beneficially removed after implantation and before diffusion of the first and second dopants.

Preferably, the first conductivity type is N-type conductivity and the second conductivity type is P-type conductivity. In this case, the first and second dopants are preferably boron dopants.

In some preferred embodiments, the source regions extend to a depth from the epitaxial layer surface that is intermediate the first and second depths.

According to one preferred embodiment of the invention: (a) the patterned implantation mask comprises a patterned masking layer disposed over a patterned BPSG layer; (b) the patterned masking layer is removed after implantation and before diffusion of the first and second dopants; (c) the apertures are enlarged in the patterned BPSG layer by a blanket wet etching step; and (d) the device is heated to elevated temperatures that are sufficient to (1) subject the BPSG layer to reflow and (2) diffuse the first and second dopants to the first and second depths.

According to another preferred embodiment, a method is provided for forming a device comprising plurality of trench MOSFET cells. The method comprises: (a) providing an N-type silicon substrate; (b) depositing an N-type silicon epitaxial layer over the substrate, the epitaxial layer having a lower majority carrier concentration than the substrate; (c) etching trenches into the epitaxial region from an upper surface of the epitaxial layer; (d) forming a silicon oxide region which lines at least a portion of the trenches; (e) forming a doped polysilicon region within the trenches adjacent the silicon oxide region; (f) forming P-type body regions within an upper portion of the epitaxial layer; (g) forming N-type source regions within upper portions of the body regions adjacent the trenches; (h) forming an patterned implantation mask over the epitaxial layer, wherein the patterned implantation mask has apertures over at least portions of the body regions adjacent the source regions, wherein the patterned implantation mask covers at least portions of the doped polysilicon region, wherein the patterned implantation mask covers at least portions of the source regions, and wherein the patterned implantation mask comprises a patterned masking layer disposed over a patterned BPSG region; (i) forming shallow dopant regions by a process comprising: (1) implanting a first P-type dopant at a first energy level within upper portions of the body regions through the apertures and (2) diffusing the first dopant at elevated temperatures to a first depth from the upper surface of the epitaxial layer; (j) forming deep dopant regions by a process comprising: (1) implanting a second P-type dopant at a second energy level within an upper portion of the body region through the apertures and (2) diffusing the second dopant at elevated temperatures to a second depth from the upper surface of the epitaxial layer; and (k) enlarging apertures in the patterned PBSG region by a blanket wet etching step. In this method, the deep and shallow dopant regions each has a higher majority carrier concentration than the body regions, the second energy level is greater than the first energy level, the second depth is greater than the first depth, and the first and second P-type dopants can be the same or different.

According to another embodiment of the present invention, a method is provided for forming shallow and deep dopant implants adjacent source regions of a first conductivity type within an upper portion of an epitaxial layer in a trench MOSFET device. The method comprises: (a) forming a patterned implantation mask over the epitaxial layer, wherein the patterned implantation mask comprises a patterned insulating region and covers at least a portion of the source regions, and wherein the patterned implantation mask has apertures over at least portions of the epitaxial layer adjacent the source regions; (b) forming shallow dopant regions by a process comprising: (1) implanting a first dopant of a second conductivity type at a first energy level within an upper portion of the epitaxial layer through the apertures and (2) diffusing the first dopant at elevated temperatures to a first depth from an upper surface of the epitaxial layer; (c) forming deep dopant regions by a process comprising: (1) implanting a second dopant of the second conductivity type at a second energy level within an upper portion of the epitaxial layer through the apertures and (2) diffusing the second dopant at elevated temperatures to a second depth from the upper surface of the epitaxial layer; and (d) enlarging apertures in the patterned insulating region. In this method, the second energy level is greater than the first energy level, the second depth is greater than the first depth, and the first and second dopants can be the same or different.

One advantage of the present invention is that a trench MOSFET device is provided which has improved parasitic resistance, and hence avalanche-handling capability.

Another advantage of the present invention is that a method is provided which is capable of reliably forming a trench MOSFET device with improved avalanche-handling capability.

Another advantage of the present invention is that a method of forming a trench MOSFET device is provided, in which final apertures within the insulating layer of the trench MOSFET device can be controlled independent of the implant locations of the deep and shallow P+ regions of the device.

Another advantage of the present invention is that a method of forming a trench MOSFET device with deep and shallow P+ regions is described, wherein a relatively large source region contact area can be produced without compromising the doping integrity of the channel portion of the body region.

The above and other embodiments and advantages of the present invention will become immediately apparent to those of ordinary skill in the art upon review of the Detailed Description and Claims to follow.

DETAILED DESCRIPTION OF PREFERRED EMBODIMENTS OF THE INVENTION

The present invention now will be described more fully hereinafter with reference to the accompanying drawings, in which preferred embodiments of the present invention are shown. This invention may, however, be embodied in different forms and should not be construed as limited to the embodiments set forth herein.

Figure 1:
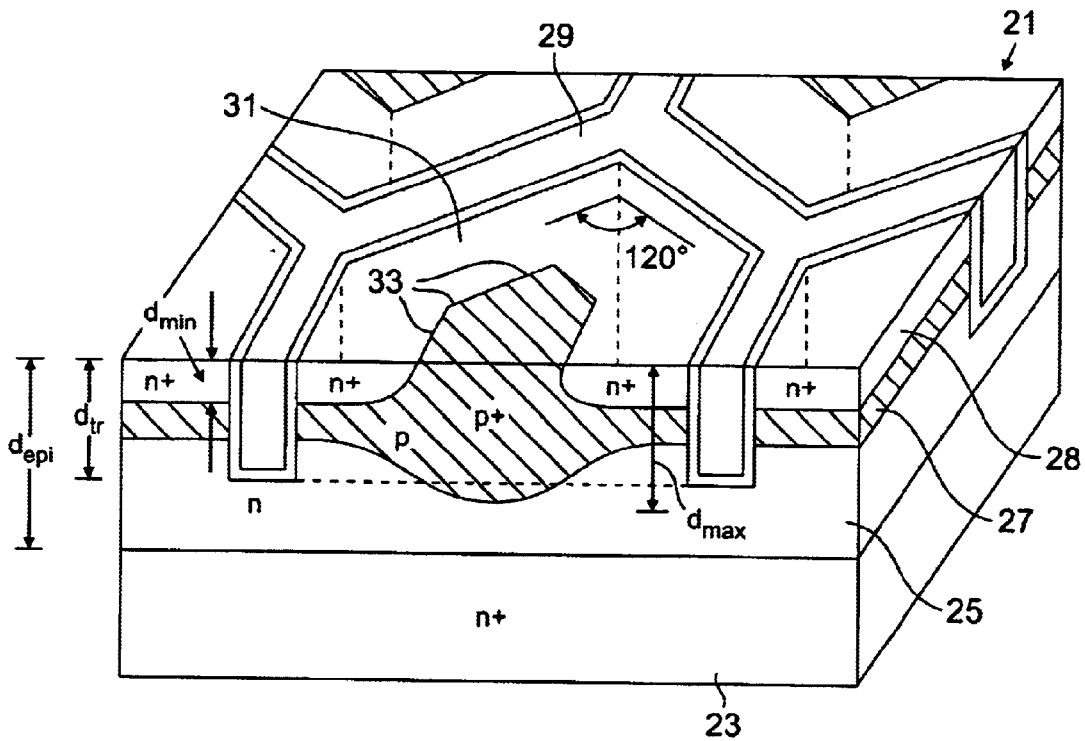
FIG. 1 is a schematic partial cross-sectional view of a trench MOSFET device in the prior art.
Figure 2:
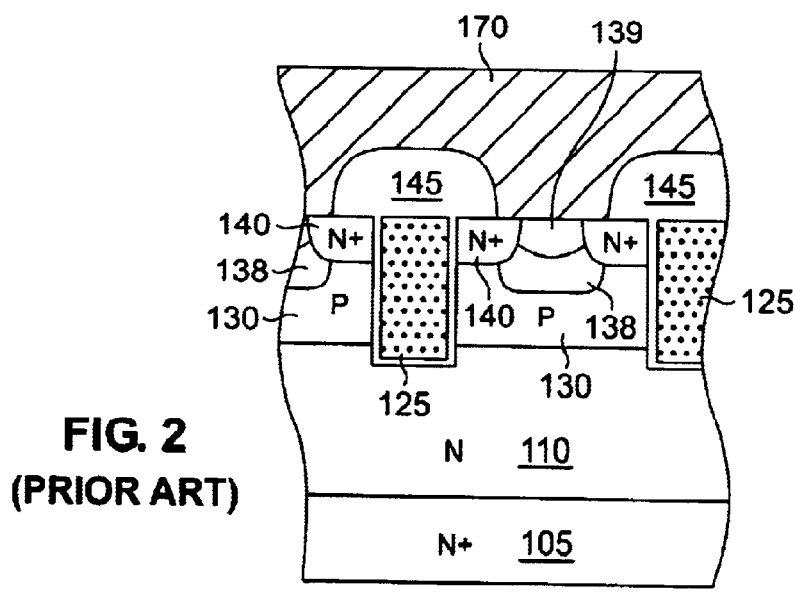
FIG. 2 is a schematic partial cross-sectional view of a trench MOSFET device in the prior art.
Figure 3:
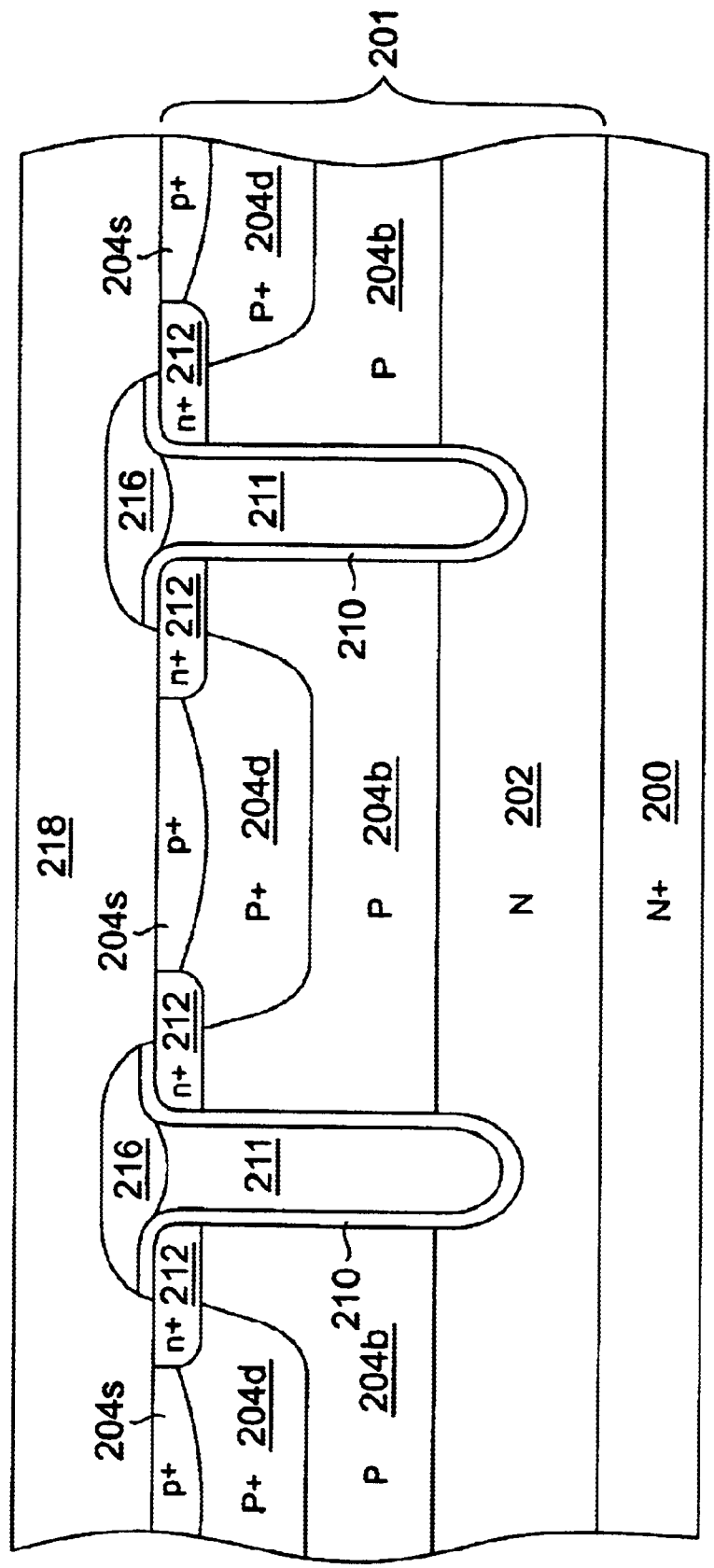
FIG. 3 is a schematic partial cross-sectional view of a trench MOSFET device produced in accordance with the present invention.

FIG. 3 illustrates a trench MOSFET in accordance with an embodiment of the present invention. In the trench MOSFET shown, an epitaxial layer 201 is provided on an N+ substrate 200.

The N+ substrate 200 in this specific example is a silicon substrate having a thickness ranging, for example, from 10 to 25 mils and a net doping concentration ranging, for example, from $10^{19}$ to $10^{20}$ cm$^{-3}$.

An N region 202 is found in the lower portion of the epitaxial layer 201. In this example, this region has a thickness ranging from, for example, 1 to 5 micron and a net doping concentration ranging, for example, from $10^{15}$ to $10^{16}$ cm$^{-3}$.

P body regions 204b are found in the middle portion of the epitaxial layer 201. In the example shown, these P-body regions 204b extend, for example, to a depth of 1 to 2 microns from the upper surface of the epitaxial layer 201 and have a net doping concentration ranging, for example, from $10^{16}$ to $10^{17}$ cm$^{-3}$.

Deep P+ regions 204d are found in an upper part of the epitaxial layer 201. In the example shown, these deep P+ regions 204d extend, for example, to a depth of 0.3 to 0.7 microns from the upper surface of the epitaxial layer 201 and have a net doping concentration ranging, for example, from $10^{18}$ to $10^{19}$ cm$^{-3}$.

Shallow P+ regions 204s are found above the deep P+ regions 204d. In the example shown, these shallow P+ regions 204s range, for example, from 0.2 to 0.5 microns in depth from the upper surface of the epitaxial layer and have a net doping concentration ranging, for example, from $10^{19}$ to $10^{20}$ cm$^{-3}$.

Trenches formed within the epitaxial layer are lined with an insulator 210, such as an oxide insulator, and are filled with a conductor 211, such as doped polysilicon, providing the gate electrode function of the device. The trenches extend, for example, to a depth of 1.5 to 3 microns from the upper surface of the epitaxial layer 201 and are, for example, 0.4 to 0.8 microns in width. Where silicon oxide (typically silicon dioxide) is used as the insulator 210, it can be for example, 500 to 700 Angstroms thick. Where polysilicon is used as the conductor 211, it can have a resistivity of, for example, 1 to 15 ohm/sq. The regions between the trenches are frequently referred to as "mesas" or "trench mesas", based on their shapes. These regions range, for example, from 1.5 to 4 microns in width.

The trench MOSFET device of FIG. 3 also contains N+ source regions 212, which extend, for example, to a depth of 0.3 to 0.5 microns from the epitaxial layer surface 201 and have net doping concentrations ranging, for example, from $10^{20}$ to $10^{21}$ cm$^{-3}$.

Metal source contact 218 makes electrical contact with the N+ source regions 212 and shallow P+ regions 204s. Insulating regions, such as BPSG (borophosphosilicate glass) regions 216, prevent the doped polysilicon regions 211 associated with the gate electrodes from being shorted to the N+ source regions 212 through the source contact 218. A separate metal gate contact (not shown) is typically connected to the gate runner portion of the polysilicon 211 located outside of the region of the trench MOSFET cells. A metal drain contact (not shown) is also typically provided adjacent the N+ substrate 200.

Although not wishing to be bound by theory, and as previously discussed in U.S. Pat. No. 6,031,265, it is believed that the deep P+ regions 204d reduce the parasitic resistance of the cell, while the shallow P+ regions 204s reduce the contact resistance at source contact 218.

A method will now be described for manufacturing a trench MOSFET like that shown in FIG. 3, in accordance with an embodiment of the present invention. As noted above, the method of the present invention allows, among other things, for the implant locations for the deep and shallow P+ regions to be controlled independently of the final apertures within the BPSG regions 216 of FIG. 3. As a result, a trench MOSFET with a relatively large source region contact area can be provided, without compromising the doping integrity of the channel portion of the body region.

Figure 4A:
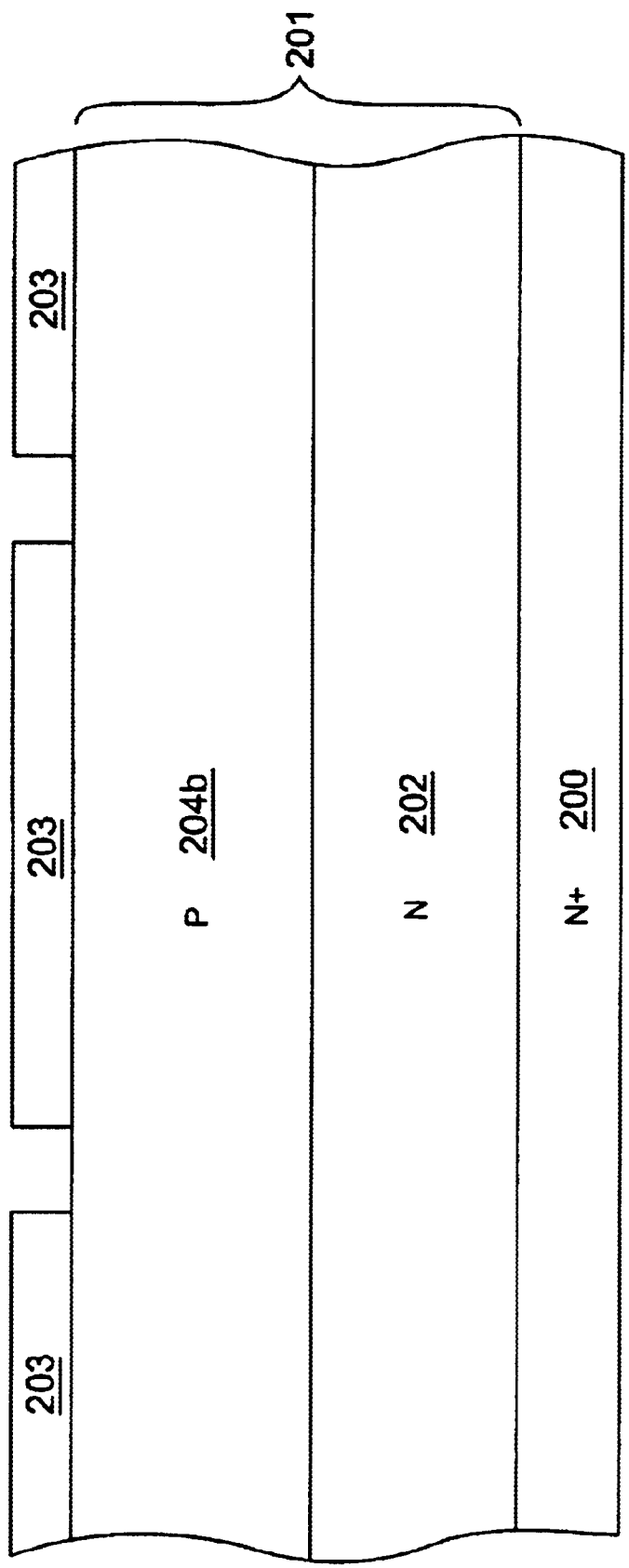
FIGS. 4A through 4D are schematic partial cross-sectional views illustrating a method of making a trench MOSFET like that of FIG. 3, in accordance with an embodiment of the present invention.

Turning now to FIG. 4A, an N doped epitaxial layer 201 is initially grown on an N+ doped substrate 200. The N+ doped substrate 200, for example, can be from 10 to 25 mils thick and have a net n-type doping concentration ranging, for example, from $10^{19}$ to $10^{20}$ cm$^{-3}$. The epitaxial layer 201, for example, can have a net n-type doping concentration of $10^{15}$ to $10^{16}$ cm$^{-3}$ and can range from 2 to 7 microns in thickness.

A P body region 204b is then formed in the epitaxial layer 201 by implantation and diffusion. For example, the epitaxial layer 201 may be implanted with boron at 20 to 50 keV with a dosage of $5 \times 10^{13}$ to $6 \times 10^{13}$, followed by diffusion at 1100 to 1200° C. for 60 to 150 minutes. This produces a P body region 204b that which is 1 to 2 microns thick and has a net p-type doping concentration of $10^{16}$ to $10^{17}$ cm$^{-3}$. After this step, a portion of the epitaxial layer 201 remains (i.e., N region 202), which is, for example, 1 to 5 microns thick. N region 202 has the n-type doping concentration that is noted above for epitaxial layer 201. A patterned trench mask layer 203 is then formed. The resulting structure is shown in FIG. 4A.

Trenches are then etched through apertures in the patterned trench mask 203, for example, by a dry anisotropic etching step. Trench depths in this example are about 1.5 to 3 microns. Discrete P body regions 204b are established as a result of this trench-forming step. A sacrificial oxide layer is typically grown within the trench and removed as is known in the art. An oxide layer 210, which is preferably 500 to 700 Angstroms thick, is then grown over the trench bottom, for example, by wet or dry oxidation at 950 to 1100° C. for 50 to 90 minutes. Portions of this oxide layer 210 ultimately form the gate oxide regions for the finished device.

Figure 4B:
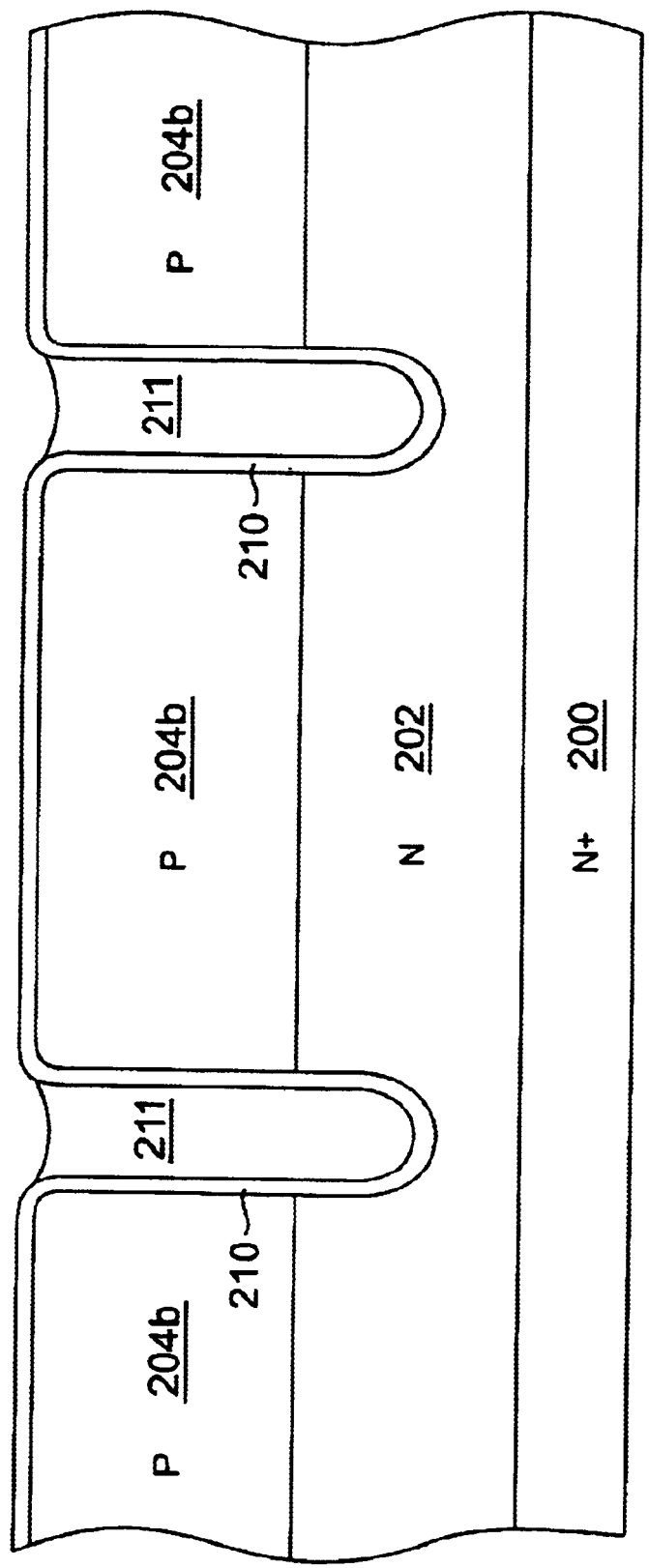

The surface of the structure is then covered, and the trenches are filled, with a polysilicon layer, preferably using CVD. The polysilicon is typically doped N-type to reduce its resistivity. N-type doping can be carried out, for example, during CVD with phosphorous chloride or by implantation with arsenic or phosphorous. The polysilicon layer is then etched, for example, by reactive ion etching. The polysilicon layer within the trench segments is commonly slightly over-etched due to etching uniformity concerns, and the thus-formed polysilicon gate regions 211 typically have top surfaces that are 0.1 to 0.2 microns below the adjacent surface of the epitaxial layer 204b. The resulting structure is shown in FIG. 4B.

Figure 4C:
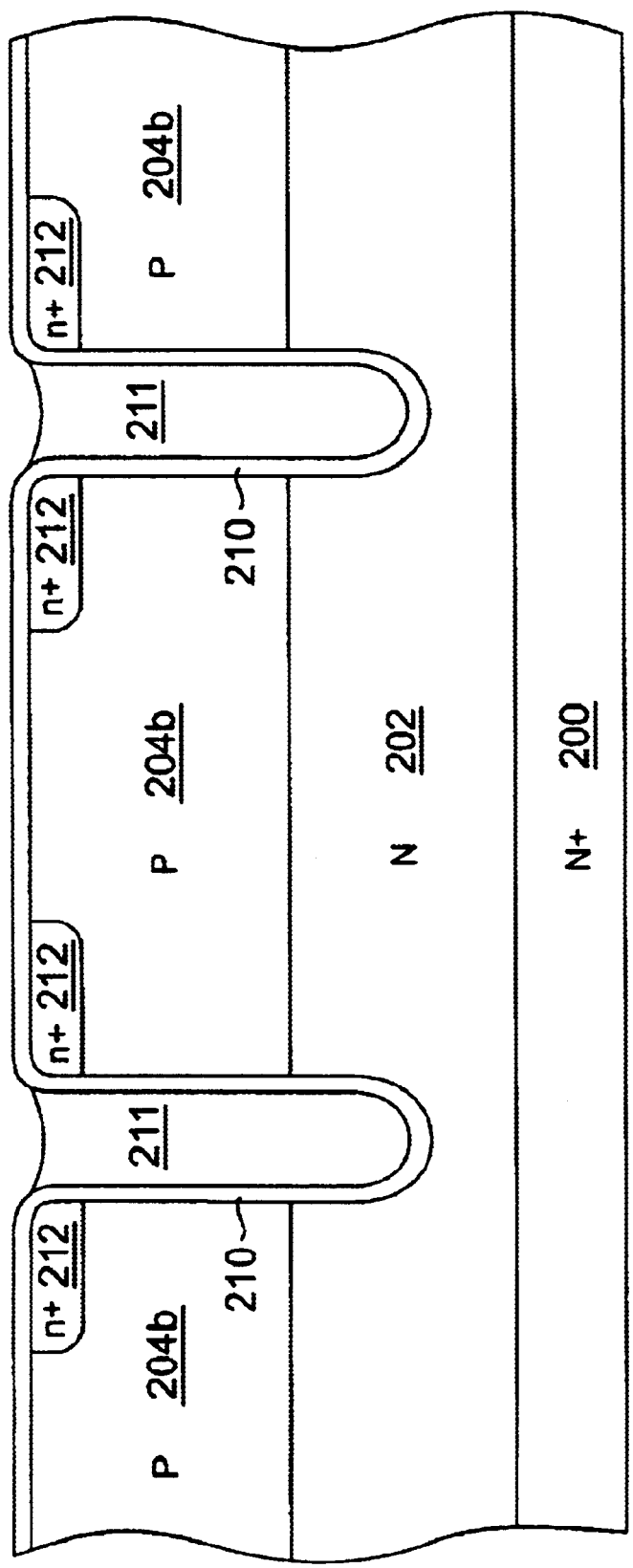

A patterned source mask (not shown) is provided over the structure. N+ source regions 212 are then formed in upper portions of the epitaxial layer by implanting an N-dopant, such as arsenic or phosphorous, through apertures in the source mask, followed by an elevated temperature diffusion process. Implantation is preferably conducted through an implant oxide to avoid implant-channeling effects, implant damage, and heavy metal contamination during formation of the source regions. For example, the structure can be implanted with phosphorous at 80 to 100 keV with a dosage of $10^{16}$ to $10^{17}$, followed by source mask stripping and diffusion at 900 to 1000° C. for 30 to 60 minutes. This produces N+ source regions 212 which extend to a depth of 0.3 to 0.5 microns from the epitaxial layer surface and have net doping concentrations ranging, for example, from $10^{20}$ to $10^{21}$ cm$^{-3}$. The resulting structure is shown in FIG. 4C.

An insulating layer, preferably a BPSG (borophosphosilicate glass) layer of 0.8 to 1.2 microns in thickness, is then deposited over the entire structure, for example, by PECVD. After providing the structure with a patterned masking layer 205, the structure is then etched, typically by reactive ion etching, removing BPSG and oxide portions of the structure that are not protected by the masking layer 205. This step forms distinct BPSG regions 216, which establish implantation apertures for the device. Distances between the BPSG regions 216 for the cross-section shown typically range between 1 and 2 microns.

Figure 4D:
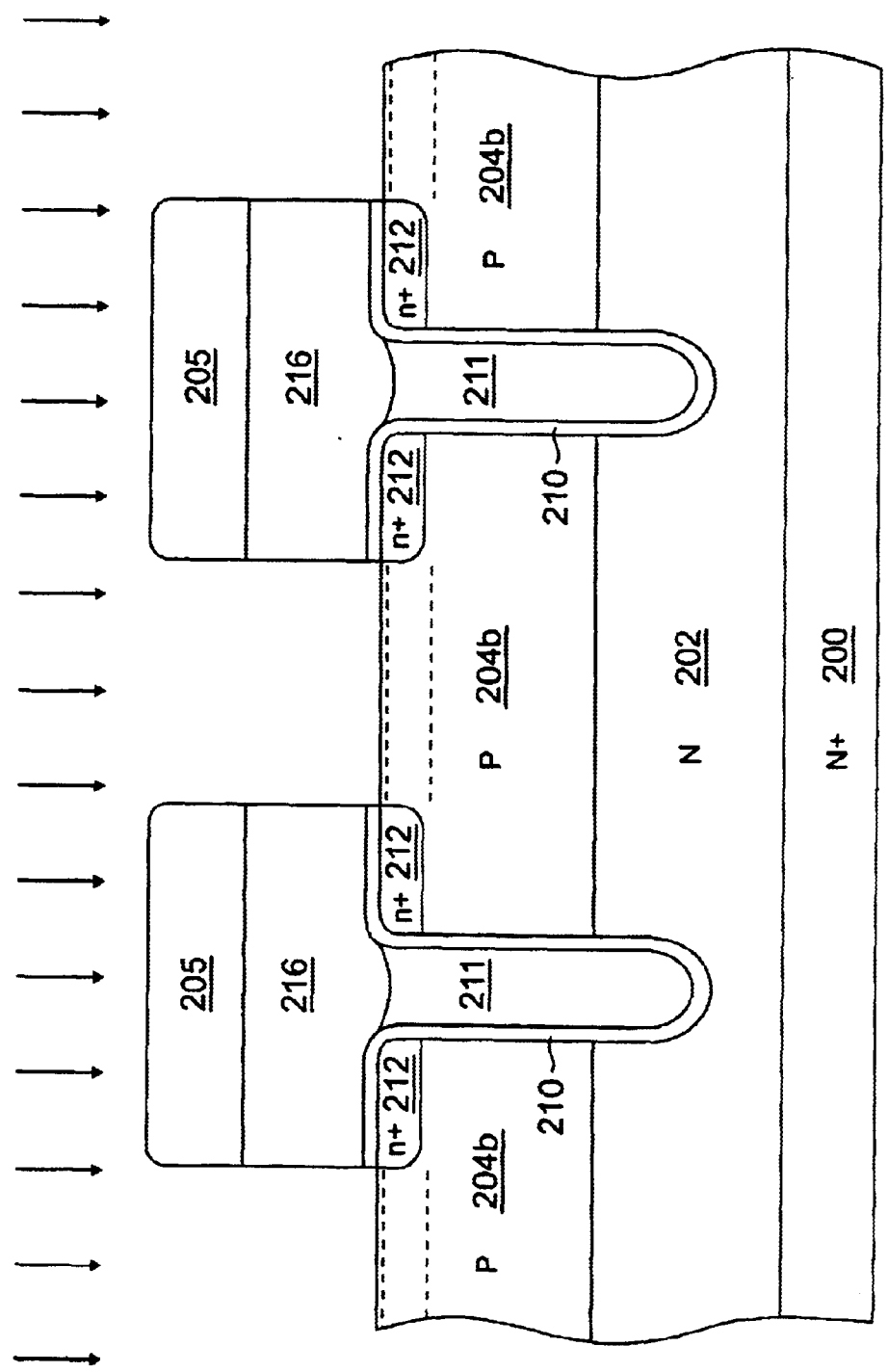

Boron is then implanted through the implantation apertures in two steps: a low energy implant step and a high energy implant step. For example, the structure can be subjected to a high-energy implantation with boron at 80 to 120 keV with a dosage of $10^{13}$ to $10^{14}$, followed by a low energy implantation with boron at 30 to 50 keV with a dosage of $10^{14}$ to $10^{15}$. Alternatively, the low energy implantation can precede the high energy one. These steps produce the structure illustrated in FIG. 4D. The upper dashed lines of FIG. 4D represent the presence of the low-energy implanted boron, while the lower dashed lines represent the presence of the high-energy implanted boron within the structure.

The resist layer 205 is then removed, and the BPSG regions 216 are blanket etched using a wet etch process such as buffered HF to provide contact windows of a targeted dimension. Distances between the BPSG regions 216 typically range between 1.5 and 2.5 microns at this stage. The BPSG is then subjected to a reflow step at 900 to 1000° C. for 20 to 50 minutes to produce BPSG regions having a final shape like that shown in FIG. 3. This reflow step also diffuses the high- and low-energy-implanted boron to its final distribution, forming deep P+ regions 204d and shallow P+ regions 204s, respectively. As noted above, the deep P+ regions 204d typically extend, for example, from 0.3 to 0.7 microns in depth from the upper surface of the epitaxial layer and have a net doping concentration ranging, for example, from $10^{18}$ to $10^{19}$ cm$^{-3}$. At the same time, the shallow P+ regions 204s typically extend, for example, from 0.2 to 0.5 microns in depth from the upper surface of the epitaxial layer and have a net doping concentration ranging, for example, from $10^{19}$ to $10^{20}$ cm$^{-3}$.

A metal contact layer is then deposited, forming source contact 218. Gate and drain contacts (not shown) are also typically provided. The resulting structure is like that illustrated in FIG. 3.

Thus, by using relatively small BPSG implant apertures for the high- and low-energy boron implantation steps, the boron is implanted at a distance from the trenches that is sufficiently great to prevent lateral boron into the channel region during the subsequent diffusion step. Moreover, by subsequently increasing the sizes of the apertures in the BPSG layer (e.g., via blanket etching), final contact windows are provided, having apertures that are larger than would otherwise be possible, due to the above-noted threat of channel diffusion. As a result, a device is provided having acceptable parasitic resistance, while at the same time having a large contact area and hence a low on-resistance.

Although various embodiments are specifically illustrated and described herein, it will be appreciated that modifications and variations of the present invention are covered by the above teachings and are within the purview of the appended claims without departing from the spirit and intended scope of the invention. As one example, the method of the present invention may be used to form a structure in which the conductivities of the various semiconductor regions are reversed from those described herein.

What is claimed is:

1. A method of forming a device comprising a plurality of trench MOSFET cells, said method comprising:

provising a substrate of a first conductivity type;

depositing an epitaxial layer of said first conductivity type over said substrate, said epitaxial layer having a lower majority carrier concentration than said substrate;

etching trenches into said epitaxial region from an upper surface of said epitaxial layer;

forming a first insulating region which lines at least a portion of said trenches;

forming a conductive region within said trenches and adjacent said first insulating region;

forming body regions of a second conductivity type within an upper portion of said epitaxial layer;

forming source regions of said first conductivity type within upper portions of said body regions adjacent said trenches;

forming a patterned implantation mask comprising a patterned second insulating region over said epitaxial layer, wherein said patterned implantation mask has apertures over at least portions of said body regions adjacent said sources, wherein said patterned implantation mask covers at least portions of said conductive region, and wherein said patterned implantation mask covers at least portions of said source regions;

forming shallow dopant regions by a process comprising: (a) implanting a first dopant of said second conductivity type at a first energy level within upper portions of said body regions through said apertures and (b) diffusing said first dopant at elevated temperatures to a first depth from said upper surface of said epitaxial layer;

forming deep dopant regions by a process comprising: (a) implanting a second dopant of said second conductivity type at a second energy level within upper portions of said body regions through said apertures and (b) diffusing said second dopant at elevated temperatures to a second depth from said upper surface of said epitaxial layer, wherein said first and second dopants can be the same or different, wherein said deep and shallow dopant regions each has a higher majority cater concentration than said body regions, wherein said second energy level is greater than said first energy level, and wherein said second depth is greater than said first depth;

enlarging the apertures in said patterned second insulating region; and forming a conductive source contact adjacent upper surfaces of said source regions and upper surfaces of said shallow doped regions.

2. The method of claim 1, wherein said patterned implantation mask comprises a patterned masking layer disposed over said patterned second insulating region.

3. The method of claim 2, wherein said patterned implantation mask is formed by a method comprising (a) depositing a layer of second insulating material, (a) forming said patterned masking layer over said layer of second insulating material, and (c) etching said layer of second insulating material in areas not covered by said patterned masking layer to form the patterned second insulating region.

4. The method of claim 1, wherein said first conductivity type is N-type conductivity and said second conductivity type is P-type conductivity.

5. The method of claim 1, wherein said source regions extend to a third depth from said epitaxial layer surface, wherein said first depth is shallower than said third depth, and wherein said second depth is deeper than said third dept.

6. The method of claim 1, wherein said patterned second insulating region is a patterned BPSG region.

7. The method of claim 6, wherein said apertures are enlarged by a blanket wet etching step.

8. The method of claim 1,
wherein said patterned implantation mask comprises a patterned masking layer disposed over a patterned BPSG layer;
wherein said patterned masking layer is removed after implantation and before diffusion of said first and second dopants;
wherein said apertures are enlarged in said patterned BPSG layer by a blanket wet etching step; and wherein said device is heated to elevated temperatures that are (a) sufficient to subject said BPSG layer to reflow and (b) sufficient to diffuse said first and second dopants to said first and second depths.

9. The method of claim 4, wherein said first and second dopants are boron dopants.

10. The method of claim 1, wherein said second dopant is implanted before said first dopant.

11. The method of claim 1, wherein said body regions are formed by forming said trenches in a region of said epitaxial layer within which a dopant of said second conductivity type has been implanted and diffused.

12. The method of claim 1, further comprising: fanning a conductive drain contact adjacent said semiconductor substrate, and forming a conductive gate contact adjacent an upper surface of said conductive region remote from said source regions.

13. A method of forming shallow and deep dopant implants adjacent source regions of a first conductivity type within an upper portion of an epitaxial layer in a trench MOSFET device, said method comprising:

forming an patterned implantation mask over said epitaxial layer, said patterned implantation mask comprising a patterned insulating region, said patterned implantation mask covering at least a portion of said source regions, and said patterned implantation mask having apertures over at least portions of said epitaxial layer adjacent said source regions;

forming shallow dopant regions by a process comprising: (a) implanting a first dopant of a second conductivity type at a first energy level within upper portions of said epitaxial layer Through said apertures and (b) diffusing said first dopant at elevated temperatures to a first depth from an upper surface of said epitaxial layer;

forming deep dopant regions by a process comprising: (a) implanting a second dopant of said second conductivity type at a second energy level within upper portions of said epitaxial layer through said apertures and (b) diffusing said second dopant at elevated temperatures to a second depth from said upper surface of said epitaxial layer, wherein said first and second dopants can be the same or different, wherein said second energy level is greater than said first energy level, and wherein said second depth is greater than said first depth; and enlarging the apertures in said patterned insulating region.

14. The method of claim 13, wherein said patterned implantation mask comprises a patterned masking layer disposed over said patterned insulating region.

15. The method of claim 13, wherein said patterned insulating region is a patterned BPSG region.

16. The method of claim 15, wherein said apertures are enlarged by wet etching step.

17. The method of claim 13,
wherein said patterned implantation mask comprises a patterned masking layer disposed over a patterned BPSG layer;
wherein said patterned masking layer is removed after implantation and before diffusion of said first and second dopants;
wherein said apertures are enlarged in said patterned BPSG layer by a blanket wet etching step; and
wherein said device is heated to elevated temperatures that are sufficient to (a) subject said BPSG layer to reflow and (b) diffuse said first and second dopants to said first and second depths.

18. A method of forming a device comprising plurality of trench MOSFET cells, said method comprising:

provibing an N-type silicon substrate;

depositing an N-type silicon epitaxial layer over said substrate, said epitaxial layer having a lower majority carrier concentration than said substrate;

etching trenches into said epitaxial region from an upper surface of said epitaxial layer;

forming a silicon oxide region which lines at least a portion of said trenches;

forming a doped polysilicon region within said trenches adjacent said silicon oxide region;

forming P-type body regions within an upper portion of said epitaxial layer;

forming N-type source regions within upper portions of said body regions adjacent said trenches;

forming a patterned implantation mask over said epitaxial layer, wherein said patterned implantation mask has apertures over at least portions of said body regions adjacent said source regions, wherein said patterned implantation mask covers at least portions of said doped polysilicon region, wherein said patterned implantation mask covers at least portions of said source regions, and wherein said patterned implantation mask comprises a patterned masking layer disposed over a patterned BPSG region;

forming shallow dopant regions by a process comprising: (a) implanting a first P-type dopant at a first energy level within upper portions of said body regions through said apertures and (b) diffusing said first dopant at elevated temperatures to a first depth from said upper surface of said epitaxial layer;

forming deep dopant regions by a process comprising: (a) implanting a second P-type dopant at a second energy level within an upper portion of said body region through said apertures and (b) diffusing said second dopant at elevated temperatures to a second depth from said upper surface of said epitaxial layer, wherein said first P-type dopant and said second P-type dopant can be the same or different, wherein said deep and shallow dopant regions each has a higher majority carrier concentration than said body regions, wherein said second energy level is greater than said first energy level, and wherein said second depth is greater than said first depth; and enlarging the apertures in said patterned PBSG region by a wet blanket step.

19. The method of claim 18, wherein said patterned masking layer is removed after implantation and before diffusion of said first and second dopants; and wherein said device is heated to elevated temperatures that are (a) sufficient to subject said BPSG layer to reflow and (b) sufficient to diffuse said first and second dopants to said first and second depths.

20. The method of claim 19, wherein said first and second P-type dopants are boron dopants.

* * * * *

UNITED STATES PATENT AND TRADEMARK OFFICE
CERTIFICATE OF CORRECTION

PATENT NO. : 6,645,815 B2  Page 1 of 1
APPLICATION NO. : 10/010483
DATED : November 11, 2003
INVENTOR(S) : Fwu-Iuan Hshieh et al.

It is certified that error appears in the above-identified patent and that said Letters Patent is hereby corrected as shown below:

Col. 1, Line 61, after "(not shown)", insert -- , --.

Col. 2, Line 45, after "apertures", delete -- , --.

Col. 3, Line 3, after "forming", change "an" to -- a --.

Col. 4, Line 12, after "forming", change "an" to -- a --.

Col. 5, Line 17, after "above", insert -- , --.

Col. 5, Line 18, after "invention", insert -- , --.

Col. 7, Line 3, after "204*b*", delete "that".

Claim 5, Col. 9, Line 54, after "third", change "dept" to -- depth --.

Claim 12, Col. 10, Line 13, after "comprising", change "fanning" to -- forming --.

Claim 13, Col. 10, Line 22, after "forming", change "an" to -- a --.

Claim 13, Col. 10, Line 32, after "layer", change "Through" to -- through --.

Claim 16, Col. 10, Line 54, after "by", insert -- a blanket --.

Claim 18, Col. 12, Line 18, after "a", change "wet blanket" to -- blanket wet etching --.

Signed and Sealed this

Twenty-second Day of January, 2008

JON W. DUDAS
*Director of the United States Patent and Trademark Office*